United States Patent
Hofmann et al.

(10) Patent No.: US 6,900,495 B2
(45) Date of Patent: May 31, 2005

(54) LAYER ARRANGEMENT, MEMORY CELL, MEMORY CELL ARRANGEMENT AND METHOD FOR PRODUCING A LAYER ARRANGEMENT

(75) Inventors: Franz Hofmann, München (DE); R. Johannes Luyken, München (DE); Wolfgang Rösner, Ottobrunn (DE)

(73) Assignee: Infineon Technologies AG (DE)

( * ) Notice: Subject to any disclaimer, the term of this patent is extended or adjusted under 35 U.S.C. 154(b) by 204 days.

(21) Appl. No.: 10/314,049

(22) Filed: Dec. 4, 2002

(65) Prior Publication Data

US 2003/0117865 A1 Jun. 26, 2003

(30) Foreign Application Priority Data

Dec. 19, 2001 (DE) .......................... 101 62 578

(51) Int. Cl.⁷ ............................................ H01L 27/108
(52) U.S. Cl. ..................... 257/302; 257/303; 438/206
(58) Field of Search .............................. 257/302, 303, 257/382; 438/206

(56) References Cited

U.S. PATENT DOCUMENTS

| | | |
|---|---|---|
| 4,877,755 A | 10/1989 | Rodder |
| 4,910,576 A * | 3/1990 | Campbell et al. ............ 257/524 |
| 5,067,002 A * | 11/1991 | Zdebel et al. ............... 257/756 |
| 5,747,371 A | 5/1998 | Robb et al. |
| 6,255,684 B1 * | 7/2001 | Roesner et al. ............. 257/302 |
| 6,541,810 B2 * | 4/2003 | Divakaruni et al. ........ 257/302 |

FOREIGN PATENT DOCUMENTS

DE     195 19 160 C1     9/1996

OTHER PUBLICATIONS

Schuppen, A., Vescan, L., Jebasinski, R., v.d. Hart, A., Luth, H. Effect of doping profiles on Si/CoSi₂ permeable base transistors. Microeletronic Engineering 18, pp. 259–266 (1992).

Risch, L. Rosner, W., Schulz, T., Transistor Verkehrt. In Spektrum der Wissenschaft, Edition Jun. 1999, p. 941.

* cited by examiner

*Primary Examiner*—David Nelms
*Assistant Examiner*—Quoc Hoang
(74) *Attorney, Agent, or Firm*—Jeffrey R. Stone; Altera Law Group, LLC

(57) ABSTRACT

The invention relates to a layer arrangement, a memory cell, a memory cell arrangement and a method for producing a layer arrangement. The layer arrangement has a monocrystalline substrate, a highly doped region in the substrate and a metallically conductive structure in the highly doped region, a partial region of the highly doped region that is arranged in a surface region of the substrate being monocrystalline.

16 Claims, 6 Drawing Sheets

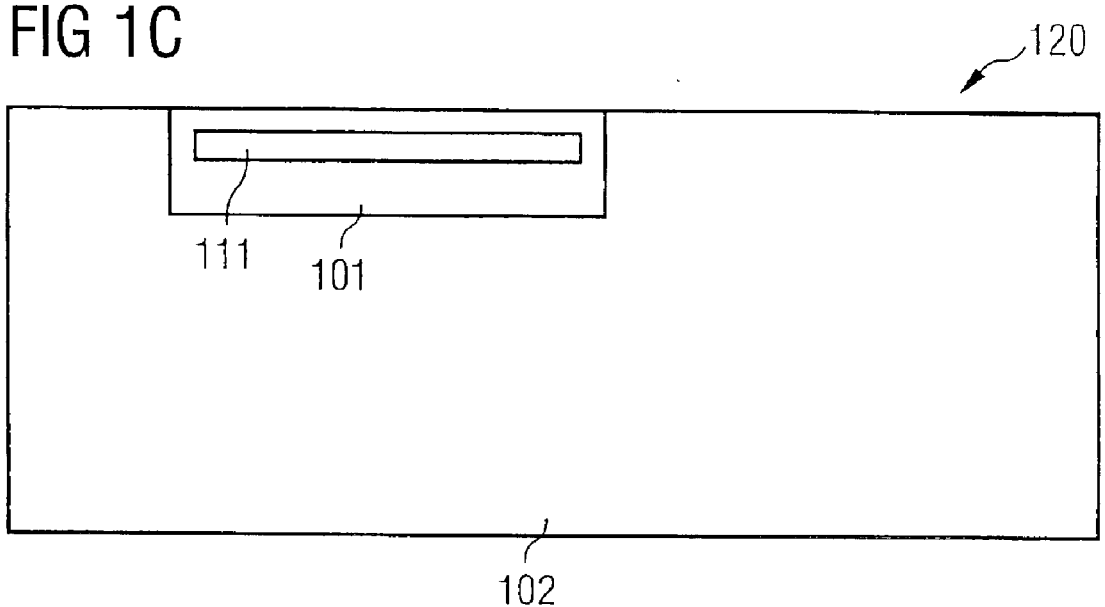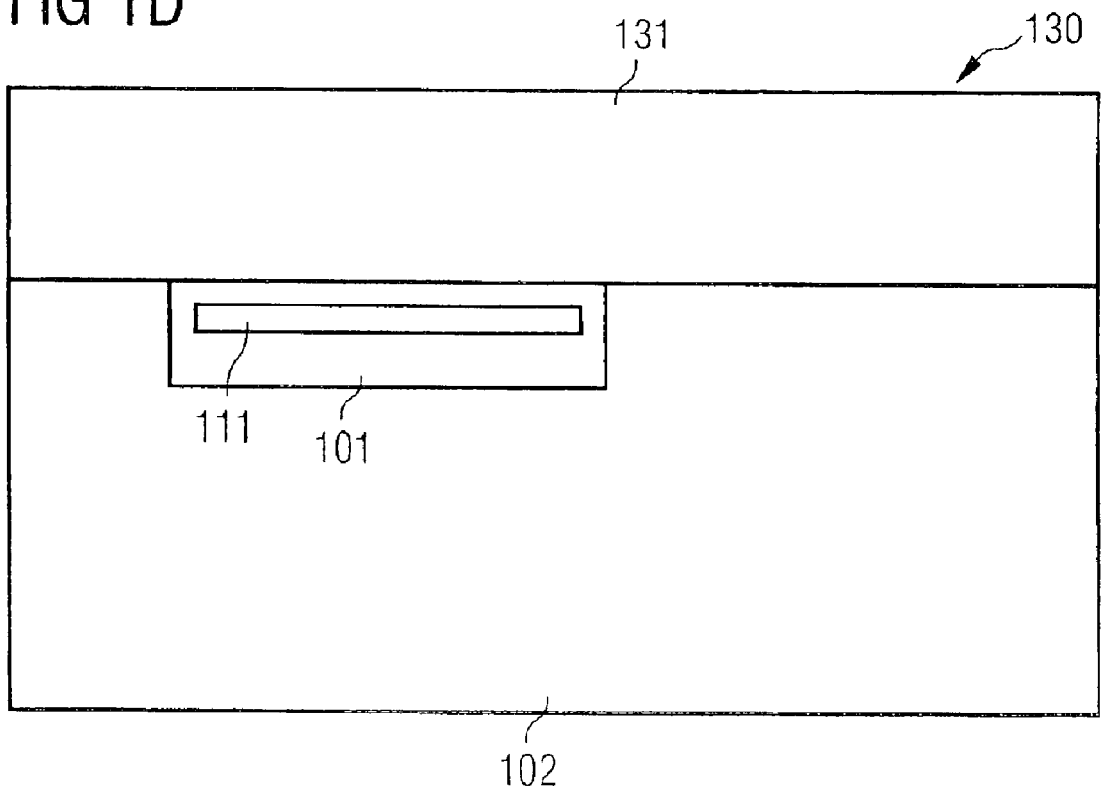

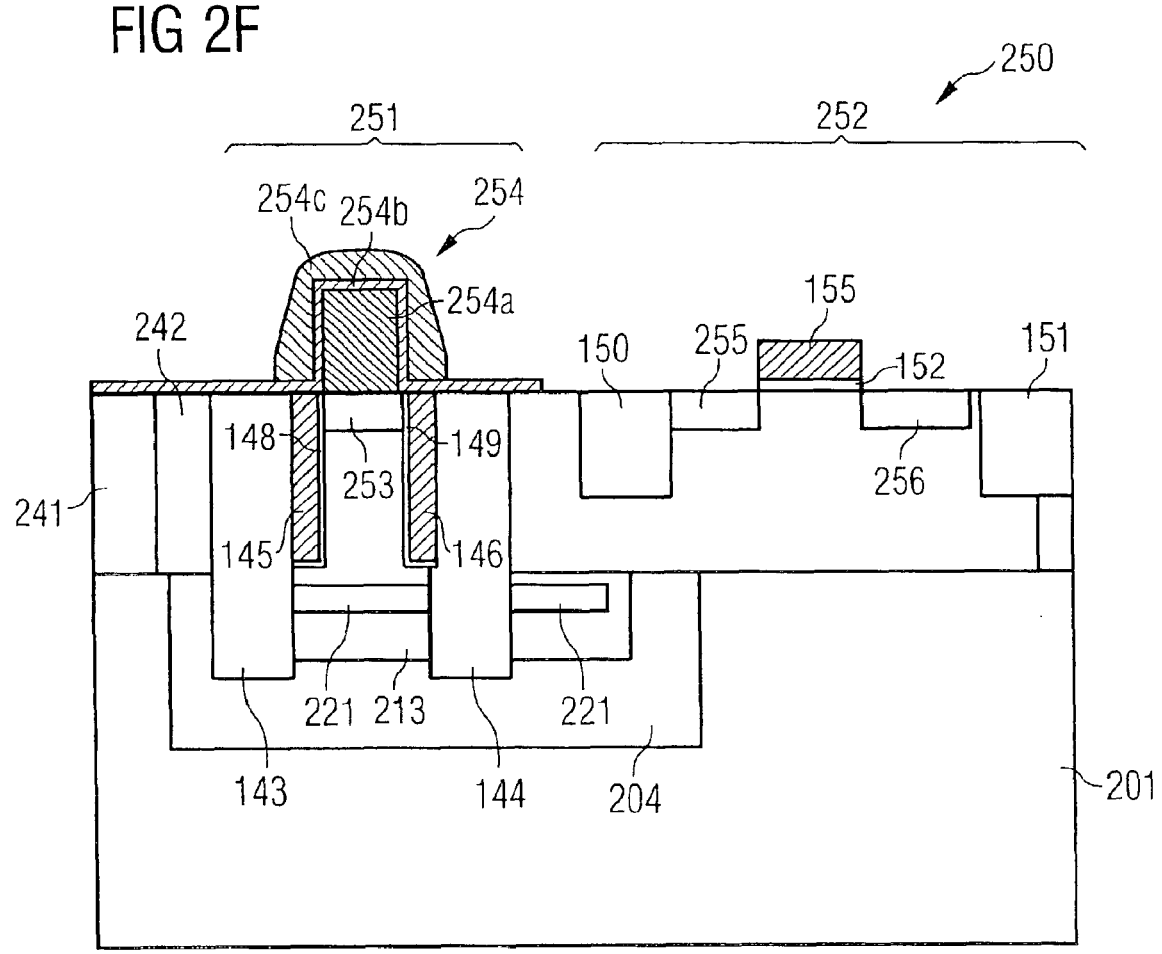

Figure 1A:
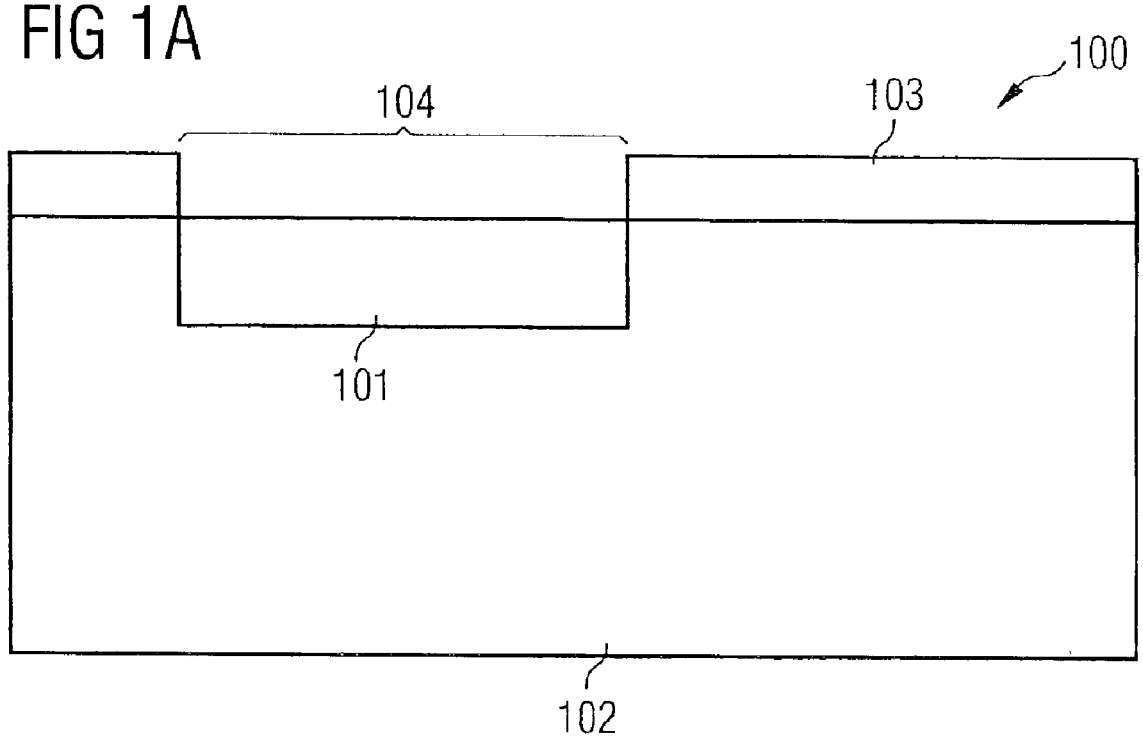

LAYER ARRANGEMENT, MEMORY CELL, MEMORY CELL ARRANGEMENT AND METHOD FOR PRODUCING A LAYER ARRANGEMENT

The invention relates to a layer arrangement, a memory cell, a memory cell arrangement and a method for producing a layer arrangement.

In an integrated circuit, the need often arises for an interconnect—formed within a substrate—for electrically coupling integrated components to one another or to peripheral electronics. A buried line of this type is subject to the requirements that the buried line is intended to be of sufficiently low ohmic resistance, so that the integrated circuit operates as fast as possible and as little waste heat as possible arises. Furthermore, the intention is to ensure a sufficient reliable coupling between different integrated components by means of the buried line. Moreover, the mechanical and electrical stability of such a buried line is intended to be high.

[1] discloses that a buried line can be produced by growing doped silicon material epitaxially on a silicon substrate. In accordance with the method described in [1], the buried line is doped using the diffusion method. In other words, a thin monocrystalline semiconductor layer made of silicon is formed on a silicon substrate which is also monocrystalline and the conductivity of the layer is increased by means of doping. Further layers are subsequently deposited over the epitaxially grown silicon layer, so that a buried line is obtained. Furthermore, it is proposed in [1], for the purpose of improving the conductivity of the buried bit line, producing the latter by the epitaxial growth of cobalt silicide ($CoSi_2$).

However, the method disclosed in [1] has the disadvantage that an epitaxially grown layer as buried line with the layer formed below it and the layer formed above it usually has dislocations, which can lead to problems with the mechanical and electrical stability of the layer arrangement. A doped epitaxially grown silicon layer furthermore has a relatively high electrical resistance, as a result of which much waste heat arises, and as a result of which electrical signals are attenuated when passing through the buried line. Furthermore, the method described in [1] has the disadvantage that the buried line is grown homogeneously on the entire silicon substrate, so that this doped layer, by way of example, is also situated below peripheral transistors of a DRAM memory cell arrangement in an undesirable manner.

One possibility for the application of laterally bounded bit lines is selective epitaxy; in this case, crystalline silicon material is grown epitaxially in a window in a surface region of the substrate, which window is defined for example by means of a patterned silicon dioxide layer, whereas a crystalline silicon layer is not formed on the silicon dioxide layer owing to the selectivity of the epitaxial growth. The epitaxial growth of doped silicon is described in the prior art. Although laterally bounded buried lines can be formed using selective epitaxy, a height difference arises in the silicon dioxide window between the regions in which silicon is grown epitaxially (for example the cell array of a DRAM memory arrangement) and those regions which are free of epitaxially grown silicon (for example regions on or in the substrate in which peripheral electronics are intended to be formed). Owing to the limited depth of focus, this leads to problems during the lithography, since the focus cannot be set for both height levels.

[2] discloses forming a buried gate electrode for a transistor by forming a laterally bounded cobalt silicide structure ($CoSi_2$) in a crystalline silicon substrate with a silicon dioxide window formed thereon, using the ion implantation method. However, the structure described in [2] is not suitable for being coupled for example to a channel region of a transistor (for example a switching transistor of a memory cell), since a high Schottky contact occurs between the buried cobalt silicide structure and a channel terminal of the transistor, which Schottky contact effects a poor electrical coupling between the two components.

[4] discloses a method for forming suicides with different thicknesses.

[5] discloses a method for producing a vertical MOSFET.

It is an object of the invention to form a buried line of sufficiently low resistance with good electrical and mechanical properties, to which line a further integrated component can be electrically coupled in an improved manner.

The object is achieved by means of a layer arrangement, a memory cell, a memory cell arrangement and a method for producing a layer arrangement having the features in accordance with the independent patent claims.

The layer arrangement according to the invention has a monocrystalline substrate, a highly doped region in the substrate and a metallically conductive structure in the highly doped region, a partial region of the highly doped region that is arranged in a surface region of the substrate being monocrystalline.

Furthermore, the invention provides a memory cell having a layer arrangement having the features mentioned. Moreover, a memory cell arrangement having a plurality of memory cells is provided.

In accordance with the invention's method for producing a layer arrangement, a highly doped region is formed in a monocrystalline substrate and a metallically conductive structure is formed in the highly doped region in such a way that a partial region of the highly doped region that is arranged in a surface region of the substrate is monocrystalline.

The layer arrangement according to the invention has the advantage that the metallically conductive structure is contained (at least partly) in the highly doped region, thereby avoiding the above-described problem known from the prior art on account of a Schottky contact between the metallically conductive structure and an integrated component to be coupled thereto. A good coupling capability between the metallically conductive structure, clearly a buried line, and a further, preferably integrated component is realized as a result. Furthermore, the problem of the formation of an undesirable topographical structure on the surface of the substrate, which problem occurs as a consequence of the selective epitaxial growth of a low-resistance structure in a silicon oxide window, is avoided since the metallically conductive structure is integrated in the substrate. Therefore, regions on the surface of the substrate below which the metallically conductive structure is formed have essentially the same topography as those surface regions of the substrate below which a metallically conductive structure is not formed. Furthermore, it is advantageous that the layer arrangement according to the invention is CMOS-compatible, and that it is possible to have recourse to highly mature and widespread standard methods for the production method, as are available in many semiconductor-technological laboratories and factories. The layer arrangement according to the invention can therefore be produced with a low outlay.

Preferred developments of the invention emerge from the dependent claims.

The layer arrangement according to the invention may have a covering layer on the surface region of the substrate.

Said layer may preferably be grown epitaxially and therefore homogeneously on the entire surface of the substrate, i.e. preferably in lattice-matched fashion. The covering layer can therefore be formed with a high quality and with few lattice defects.

The substrate is preferably a silicon substrate, for example a silicon wafer.

The metallically conductive structure may have a metallic material; in particular, the metallically conductive structure may have silicide material (clearly an alloy of silicon and a metal), such as, for example, cobalt silicide ($CoSi_2$), tungsten silicide ($WSi_2$) or nickel silicide. It must be stressed that any other suitable silicide can also be used for the metallically conductive structure, provided that it has a sufficiently low electrical resistance and can be incorporated into a silicon lattice. What is particularly advantageous is cobalt silicide which is lattice-matched on silicon, so that a good electrical and mechanical coupling is realized between a metallically conductive structure made of cobalt silicide and a crystalline silicon structure surrounding this layer. In particular, cobalt silicide has the advantage of a very low electrical resistance.

The covering layer is preferably formed from monocrystalline material. In particular, the covering layer may be grown epitaxially on a part or on the entire surface of the layer arrangement, since a partial region of the highly doped region that is arranged in a surface region of the substrate is monocrystalline. It is therefore possible, despite a doping of the highly doped region with impurity atoms, to deposit a covering layer epitaxially on the entire wafer surface.

It should be noted that the highly doped region of the layer arrangement may be doped with doping atoms of the n conduction type, for example with phosphorus, arsenic and/or antimony. As an alternative, the highly doped region may be doped with doping atoms of the p conduction type, in particular with boron, indium, gallium and/or aluminum.

The metallically conductive structure need not necessarily be a contiguous, layer-like structure, but rather may be formed for example from a plurality of clusters (with one-dimensional dimensions of, for example, approximately 20 nm).

Furthermore, a transistor with a first and a second source/drain region may be formed in and/or on the layer arrangement, the first source/drain region preferably being coupled to the metallically conductive structure.

On account of the highly doped region in the substrate, an electrical coupling between the metallically conductive structure and the integrated transistor is possible without problems with a Schottky contact arising.

In particular, the transistor may be a vertical transistor. A vertical transistor is a transistor whose channel region is formed essentially perpendicularly to the surface of a substrate in which the vertical transistor is integrated. A vertical transistor has the advantage that it has a small space requirement on the surface of the silicon substrate, and that, while maintaining the small space requirement, the length of the channel region can be made sufficiently large, even with advancing miniaturization, without disturbing short channel effects occurring. A vertical transistor of the layer arrangement according to the invention can be formed using a method for forming a vertical transistor as is described for example in [1] or in [3].

The layer arrangement according to the invention may preferably have a capacitor formed therein and/or thereon, the capacitor being able to be coupled to the second source/drain region of the transistor.

In particular, the capacitor may be embodied as a stacked capacitor.

Clearly, in accordance with the configuration described, the metallically conductive structure may serve as a bit line and the transistor as a switching transistor. The capacitor, which preferably has a dielectric having a high value of the relative dielectric constant $\in$ (so-called "high-k material") arranged between its two electrically conductive capacitor elements (in a stacked capacitor clearly the analog of capacitor plates in a conventional capacitor), may form the storage capacitor of a dynamic RAM memory (DRAM, "dynamic random access memory").

The highly doped region is preferably bounded laterally in the substrate of the layer arrangement according to the invention.

In accordance with this configuration, the highly doped layers are formed at defined locations, and what can thus be achieved is, for example, that a region of the substrate with a peripheral component is free from a buried line. This makes it possible for arbitrary, contiguous or non-contiguous regions of the surface of the layer arrangement to have a buried line within them, whereas other regions, in which this is desired, are free from a buried line within them.

With regard to the memory cell arrangement having a plurality of memory cells, each of which has a layer arrangement having the features described above, it should be noted that said memory cell arrangement may preferably be formed as a dynamic RAM memory (DRAM memory). As an alternative, the memory cell arrangement may be formed as an EEPROM ("electrically-erasable programmable read-only memory") with a floating gate memory as memory type.

The method according to the invention for producing the layer arrangement according to the invention is described in more detail below. Refinements of the layer arrangement also apply to the method for producing the layer arrangement.

The covering layer may preferably be grown epitaxially on the surface region of the substrate.

The highly doped region of the layer arrangement may be formed using an ion implantation method or using a diffusion method.

The metallically conductive structure is preferably formed using the ion implantation method.

The use of the ion implantation method has the advantage that, by means of suitable adjustment of the process parameters such as, for example, the ion energy, a desired doping profile can be set flexibly to the requirements of the individual case. In particular, it is thereby possible to set the depth of the metallically conductive structure within the layer arrangement, i.e. clearly the distance between the metallically conductive structure and the surface of the layer arrangement, and the width of the layer arrangement in the vertical direction.

In accordance with a further refinement of the production method according to the invention, the highly doped region in the substrate and/or the metallically conductive structure in the highly doped region is/are bounded laterally using at least one auxiliary layer by a procedure in which, before carrying out the ion implantation, the at least one auxiliary layer is deposited on the layer arrangement and patterned using a lithography and etching method.

An auxiliary layer, preferably made of silicon dioxide, may be applied on the surface region and be photopatterned, for example. Windows in the auxiliary layer make it possible to define the surface regions of the layer arrangement below which the metallically conductive structure is formed.

A diffusion region may be formed on the surface of the monocrystalline substrate by means of the implantation of doping atoms, thereby forming the highly doped region. With the aid of a suitable auxiliary structure, for example a silicon dioxide mask, highly doped regions can be doped in a laterally bounded manner with a charge carrier concentration of typically between $10^{19}$ cm$^{-3}$ and $10^{20}$ cm$^{-3}$. It should be pointed out that a doping of a p-type substrate with doping atoms of the n conduction type can be carried out without further preliminary steps (and also a p-type doping in the case of an n-type substrate), whereas a doping of a p-type substrate with doping atoms of the p conduction type requires that an n-doped well region be introduced into the p-type substrate beforehand, for example using an additional implantation method (it should be noted that the method can alternatively be carried out in a similar manner with an n-type substrate and with an n-type doping). Afterward, cobalt with a dose of $10^{17}$ cm$^{-2}$, for example, can be implanted into the silicon dioxide window or windows, as a result of which the metallically conductive structure is formed in the highly doped region. A protective layer made of silicon dioxide may subsequently be applied, which prevents defects from arising in the solid-state lattice during an optional annealing method that is to be carried out later. The annealing can be effected by heating the above-described layer arrangement to a temperature of 750° C. for approximately 30 seconds and then heating it to 1150° C. for a time of 10 seconds, as a result of which a cobalt silicide layer (CoSi$_2$) with a thickness of approximately 60 nm is formed. This cobalt silicide layer has a significantly lower electrical resistance than the diffusion region, i.e. the highly doped region. After the removal of the silicon dioxide layer or silicon dioxide layers, silicon material can be grown epitaxially over the entire surface of the layer arrangement obtained, said silicon material preferably having the same dopant concentration as the silicon substrate. If a p-MOS transistor is intended to be formed in the layer arrangement in subsequent method steps, a further well of the n conduction type can be implanted into the epitaxial layer. Transistors, preferably vertical transistors, can then be integrated. Either n-MOS transistors or p-MOS transistors can be produced, depending on whether or not n-doped well regions were introduced into the layer arrangement beforehand. The channel length of such transistors configured as vertical transistors is adjustable by setting the thickness of the epitaxial layer grown, that is to say the thickness of the covering layer, and the depth of the implantations of the highly doped region in the substrate.

Exemplary embodiments of the invention are illustrated in the figures and are explained in more detail below.

Figure 1B:
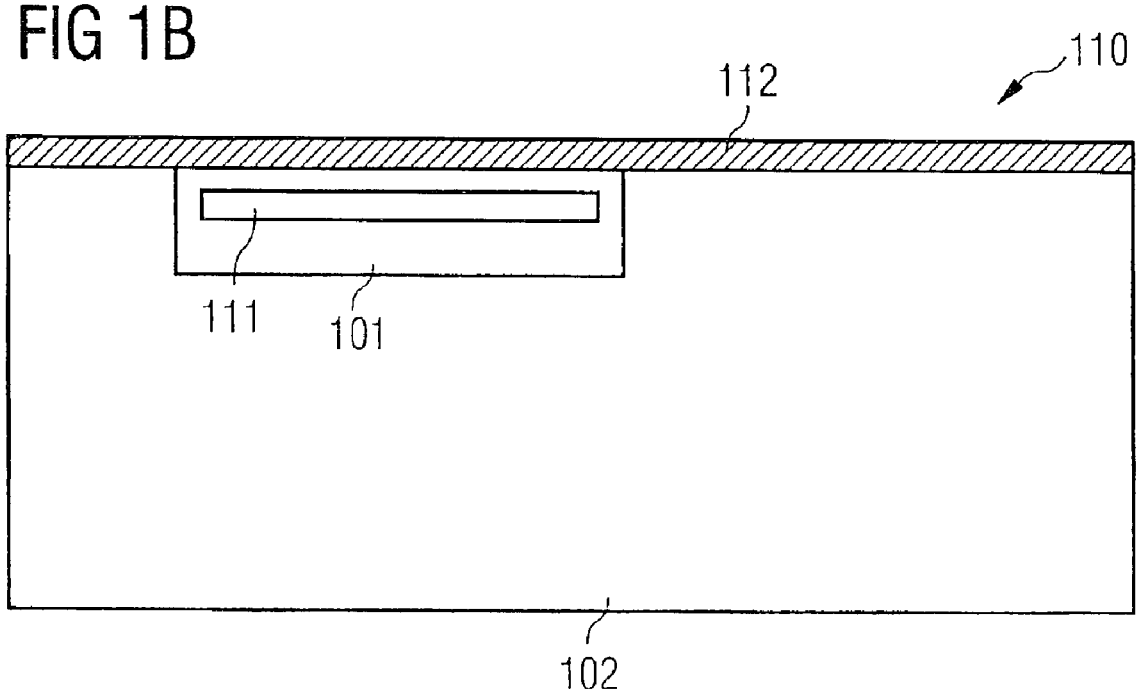
Figure 1E:
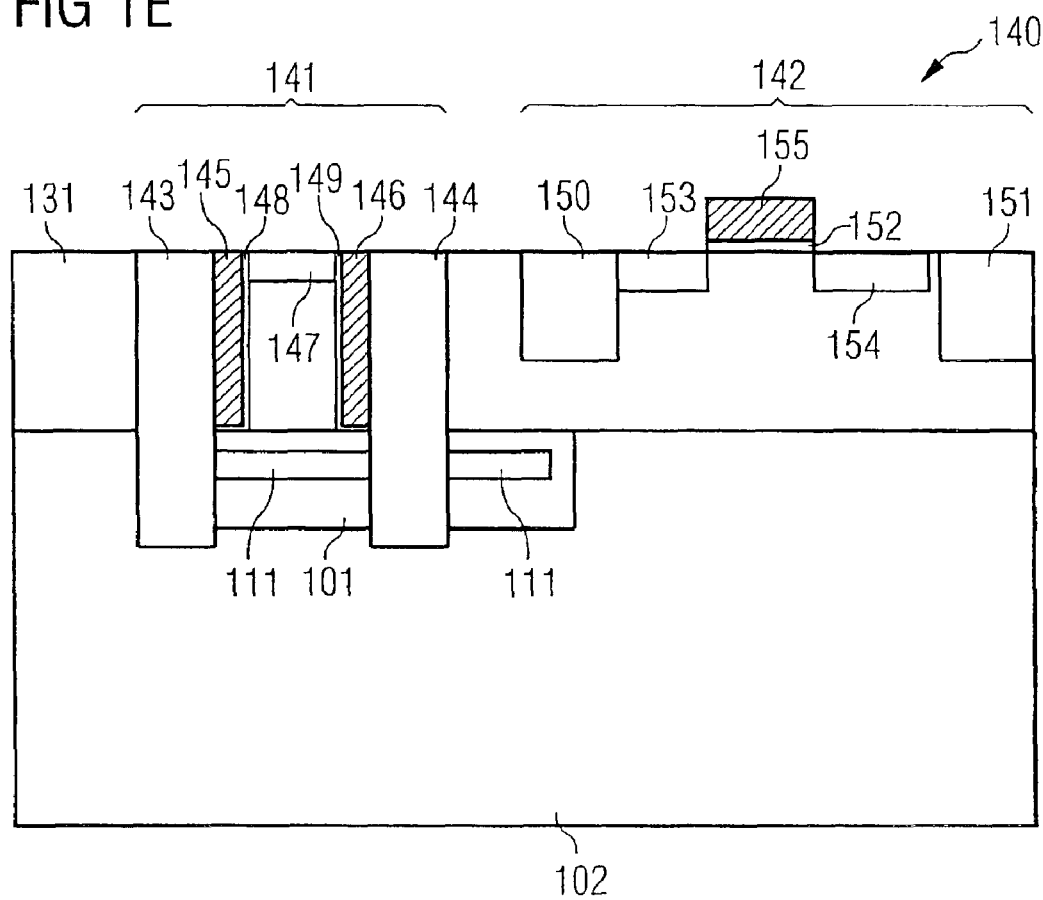
Figure 2A:
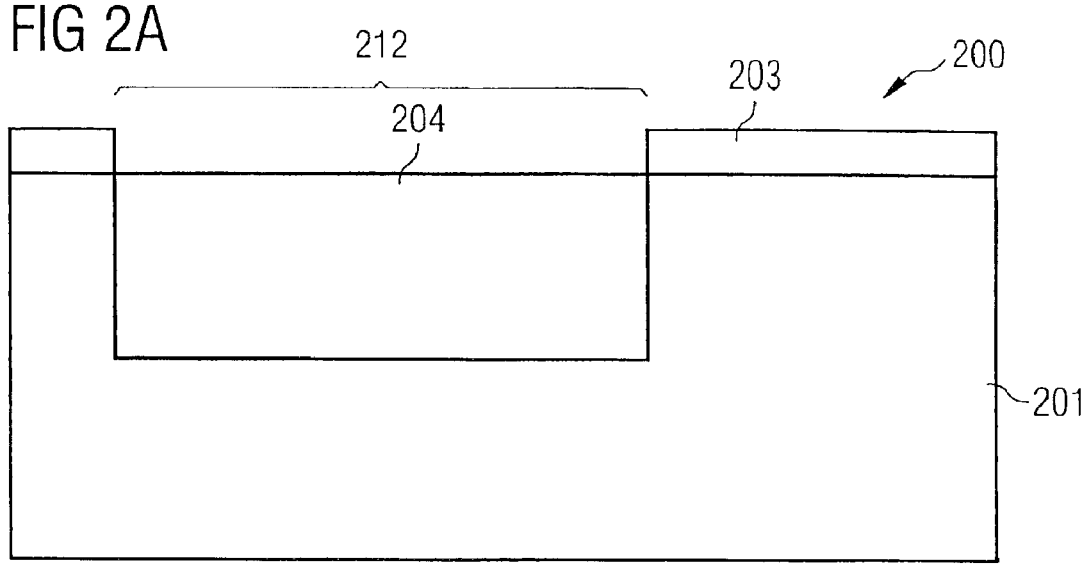

In the figures:

FIGS. 1A to 1D show layer sequences at different points in time during a method for producing a layer arrangement in accordance with a first exemplary embodiment of the invention, FIG. 1E shows a layer arrangement, produced in accordance with the first exemplary embodiment of the invention's method for producing a layer arrangement, FIGS. 2A to 2E show layer sequences at five points in time during a method for producing a layer arrangement in accordance with a second exemplary embodiment of the invention, FIG. 2F shows a layer arrangement, produced in accordance with the second exemplary embodiment of the invention's method for producing a layer arrangement.

A method for producing a layer arrangement in accordance with a first exemplary embodiment of the invention is described below with reference to FIG. 1A to FIG. 1E.

The layer sequence 100 shown in FIG. 1A is obtained by forming a first n$^+$-doped region 101 in a monocrystalline silicon substrate 102. With regard to the selection of a suitable dopant concentration, it is necessary to choose a dopant concentration low enough to enable a layer to be grown epitaxially on the first n$^+$-doped region 101, and it is necessary to choose a dopant concentration high enough to keep the contact resistance of the first n$^+$-doped region 101 with respect to adjacent electrically conductive layers as low as possible. Weighing up the two aspects means that a dopant concentration of, for example, $10^{20}$ cm$^{-3}$ for the first n$^+$-doped region 101 is a good choice. The first n$^+$-doped region 101 in the silicon substrate 102 is bounded laterally, that is to say in the horizontal direction in accordance with FIG. 1A, using a first silicon dioxide layer 103 by a procedure in which, before the doping of the first n$^+$-doped region 101, the first silicon dioxide layer 103 is deposited on the silicon substrate 102 and is patterned using a lithography and an etching method.

In other words, a silicon dioxide layer is deposited on the silicon substrate 102, for example using a CVD method ("chemical vapor deposition"), and is patterned using a lithography and an etching method in such a way that the silicon dioxide window 104 shown in FIG. 1A is formed. Arsenic ions are then introduced into the silicon substrate using a diffusion method, whereby the first n$^+$-doped region 101 is formed.

In order to obtain the layer sequence 110 shown in FIG. 1B, a metallically conductive structure 111 made of cobalt silicide (CoSi$_2$) is formed in the first n$^+$-doped region 101 in such a way that a partial region of the first n$^+$-doped region 101 that is arranged in a surface region of the substrate is monocrystalline. $10^{17}$ cm$^{-2}$, for example, is a good choice of cobalt implantation dose. Furthermore, a second silicon dioxide layer 112 is applied on the layer sequence 110 obtained, whereby the layer sequence 110 shown in FIG. 1B is obtained.

These method steps are described in more detail below. Firstly, accelerated cobalt ions are introduced using the ion implantation method in the free surface region of the layer sequence 100 that is defined by means of the silicon dioxide window 104, which cobalt ions are introduced, in accordance with their energy, at a predeterminable distance from the surface of the layer sequence 100 and in a specific vertical width region within the first n$^+$-doped region. In other words, the doping profile of the metallically conductive structure 111 can be set by adjusting the process parameters of the ion implantation method. Afterward, the first silicon dioxide layer 103 is removed from the surface of the layer sequence and a homogeneous, second silicon dioxide layer 112 is applied on the entire surface of the layer sequence, whereby the layer sequence 110 shown in FIG. 1B is obtained. The second silicon dioxide layer 112 has the function of a protective layer during a thermal annealing method that is to be carried out later. It should be noted that, in order to define the lateral width of the metallically conductive structure 111, it is alternatively possible for a separate, further silicon dioxide layer different from the first silicon dioxide layer 103 to be applied to the surface of the layer sequence and to be patterned to give definition to a further silicon dioxide window, as a result of which the lateral width of the metallically conductive structure 111 can be adjusted independently of the lateral width of the first n$^+$-doped region 101.

In order to obtain the layer sequence 120 shown in FIG. 1C, a thermal annealing method ("rapid thermal annealing") is carried out. For this purpose, the layer sequence 110 is exposed to heating to 750° C. for 30 seconds and to heating to 1150° C. for 10 seconds, as a result of which the metallically conductive structure 111 is transformed into a stable cobalt silicide layer. The second silicon dioxide layer 112 is subsequently removed from the surface. It should be noted that, as an alternative to the described configuration of the method according to the invention, the first silicon dioxide layer 103 can alternatively be removed from the surface of the layer sequence together with the second silicon dioxide layer 112 only once the thermal annealing method has been carried out. In accordance with this scenario, the first silicon dioxide layer 103 can serve in a supporting manner as an additional partial protective layer during the thermal annealing method.

The dimensioning of the first n$^+$-doped region 101 and of the metallically conductive structure 111 depends on the process parameters and can therefore be set flexibly to the requirements of the individual case. The lateral extent of the components 101, 111 is limited by the spatial resolution of the lithography methods used in the formation of the components, so that a lower limit is approximately of the order of magnitude of 100 nm to some 100 nm. In accordance with the exemplary embodiment described, the vertical extent of the first n$^+$-doped region 101 is 150 nm. In accordance with the exemplary embodiment described, the metallically conductive structure 111 having a thickness of approximately 60 nm lies about 50 nm below the surface of the first n$^+$-doped region 101 in the vertical direction. The dimensions mentioned can be determined in particular by the setting of the process parameters (ion energy, ion dose) of the ion implantation method for forming the metallically conductive structure 111.

In order to obtain the layer sequence 130 shown in FIG. 1D, a covering layer 131 is grown epitaxially on the surface region of the layer sequence 120. It should be pointed out, in particular, that an epitaxial growth is also possible on such a surface region of the layer sequence 120 on which the first n$^+$-doped region 101 is formed. This results from the fact that the partial region of the first n$^+$-doped region 101 that is arranged in a surface region of the layer sequence 120 is monocrystalline. In other words, the process parameters during the diffusion method for doping the first n$^+$-doped region 101 are set in such a way that an epitaxial growth of silicon is also possible on this surface region doped with arsenic ions. As shown in FIG. 1D, the entire surface region of the layer sequence 120 is covered with the monocrystalline, epitaxially grown covering layer 131.

FIG. 1E shows a layer arrangement 140 in accordance with a first exemplary embodiment of the invention. It is described below how the layer arrangement 140 is obtained from the layer sequence 130 shown in FIG. 1D in accordance with the first exemplary embodiment of the production method according to the invention.

The layer arrangement 140 is obtained by introducing an n-MOS vertical transistor 141 in a first surface region of the layer sequence 130 and by forming an n-MOS peripheral transistor 142, formed as a planar transistor, in a second surface region of the layer sequence 130.

It is described below how the transistors 141, 142 are formed. The production of the n-MOS vertical transistor 141 is described first, and then the production of the n-MOS peripheral transistor 142. It should be pointed out that some or all of the method steps for forming the transistors 141, 142 can be combined, i.e. can be formed together with respect to time, or, as an alternative, the transistors 141, 142 can be formed one after the other (as described below). Furthermore, it should be pointed out that vertical transistors can also be formed in the layer sequence 130, shown in FIG. 1D, in the manner described in [1] or in [3].

The way in which the n-MOS vertical transistor 142 is formed will be described first.

The n-MOS vertical transistor 141 is formed from the first n$^+$-doped region 101, which has the functionality of a first source/drain region, from a first and a second insulation structure 143, 144 made of silicon dioxide for electrically decoupling the n-MOS vertical transistor 141 from the surroundings, from a first and a second polysilicon structure 145, 146, which have the functionality of a gate electrode, from a third and a fourth insulation structure 148, 149 made of silicon dioxide material, which have the functionality of a gate oxide layer, and from a second n$^+$-doped region 147, which has the functionality of a second source/drain region. The channel region of the n-MOS vertical transistor 141 is formed by that partial region of the covering layer 131 which is bounded by the elements 148, 149, 147, 101. It should be pointed out that both the silicon substrate 102 and the covering layer 131 are p-doped. An electrical coupling of the n-MOS vertical transistor 141 to external electronics or to further integrated components is realized since the first source/drain region of the n-MOS vertical transistor 141 is coupled to the metallically conductive structure 111 in a manner avoiding a Schottky contact, which structure can serve as a buried bit line of a memory cell.

In order to form the n-MOS vertical transistor 141 proceeding from the layer sequence 130 from FIG. 1D, two trenches are introduced into the surface of the layer sequence 130, which trenches extend in the horizontal direction in accordance with FIG. 1E along the extent of the first insulation structure 143 and the first polysilicon structure 145 and, respectively, along the second polysilicon structure 146 and the second insulation structure 144, and which extend in the vertical direction in accordance with FIG. 1E right into a depth region of the layer sequence 130, which depth region corresponds to the depth of the covering layer 131. The two trenches formed in this way are thermally oxidized at the inner side, as a result of which the third and fourth insulation structures 148, 149 are formed as thin layers at the walls of the trenches. In a further partial step, the two trenches are filled with polysilicon material which is etched back using a lithography and an etching method in such a way that polysilicon material remains only in the regions of the first and the second polysilicon structure 145, 146 which are shown in FIG. 1E. In a further method step, the remaining trench regions are etched further in the vertical direction in accordance with FIG. 1E, and the resultant cavities are filled with silicon dioxide material, thereby forming the first and second insulation structures 143, 144. Using a further lithography and etching method and a further implantation method, the second n$^+$-doped region 147 is formed in a surface region of the layer arrangement 140.

The way in which the n-MOS peripheral transistor 142 is produced is described below.

It should be pointed out that, on account of the first n$^+$-doped region 101 formed in a laterally bounded manner and the metallically conductive structure 111, using the silicon dioxide window 104, the metallically conductive structure 111 is for the most part not formed in that region of the layer arrangement 140 in which the n-MOS peripheral transistor 142 is formed.

The n-MOS peripheral transistor 142 has a fifth insulation structure 150 and a sixth insulation structure 151 made of silicon dioxide material, by means of which insulation structures 150, 151 the n-MOS peripheral transistor 142 is electrically decoupled from the surroundings. Furthermore, the n-MOS peripheral transistor 142 has a third n$^+$-doped region 153 as first source/drain region and a fourth n⁺-doped region 154 as second source/drain region, which are formed in two surface regions of the layer arrangement 140 that are arranged at a distance from one another. A seventh insulation structure 152 is formed as a gate oxide layer on the surface of the layer arrangement 140 between the third and fourth n⁺-doped regions 153, 154. A third polysilicon structure 155 is formed on the seventh insulation structure 152 and has the functionality of a gate electrode.

The n-MOS peripheral transistor 142 is formed by firstly introducing trenches into the layer arrangement 140 using a lithography and an etching method, which trenches, after being filled with silicon dioxide material, form the fifth and sixth insulation structures 150, 151. Furthermore, a thin silicon dioxide layer and a polysilicon layer are deposited onto a right-hand surface region of the layer arrangement 140 in accordance with FIG. 1E and are patterned using a lithography and an etching method in such a way that the seventh insulation structure 152 and the third polysilicon structure 155 remain as a result. The stack formed by the laterally patterned seventh insulation structure 152 and the laterally patterned third polysilicon structure 155 is used as a mask in order to form the third and fourth n⁺-doped regions 153, 154 in a subsequent implantation method.

It should be noted that both the n-MOS vertical transistor 141 and the n-MOS peripheral transistor 142 are formed as n-MOS transistors, in other words the source/drain terminals 101, 147 and 153, 154, respectively, are n⁺-doped regions, whereas the channel region in both transistors 141, 142 is a partial region of the covering layer 131 of the p conduction type.

A second exemplary embodiment of the invention's method for producing a layer arrangement is described below with reference to FIG. 2A to FIG. 2F, in which transistors that are formed are of the p conduction type. In order to form a p-MOS transistor in a p-type substrate, it is necessary to form an n-doped well region in a p-doped substrate.

In order to obtain the layer sequence 200 shown in FIG. 2A, on a p-doped monocrystalline silicon substrate 201, a first silicon dioxide window 202 is formed in a first silicon dioxide layer 203 using a lithography and an etching method. The lateral dimensioning of the first silicon dioxide window 202 is used to define the lateral extent of the n-doped well region that is subsequently to be introduced in a surface region of the monocrystalline p-type silicon substrate 201. A first n-doped well region 204 is subsequently formed in the silicon substrate 201 using a diffusion method by means of the indiffusion of doping atoms of the n conduction type (for example arsenic or phosphorus atoms).

Figure 2B:
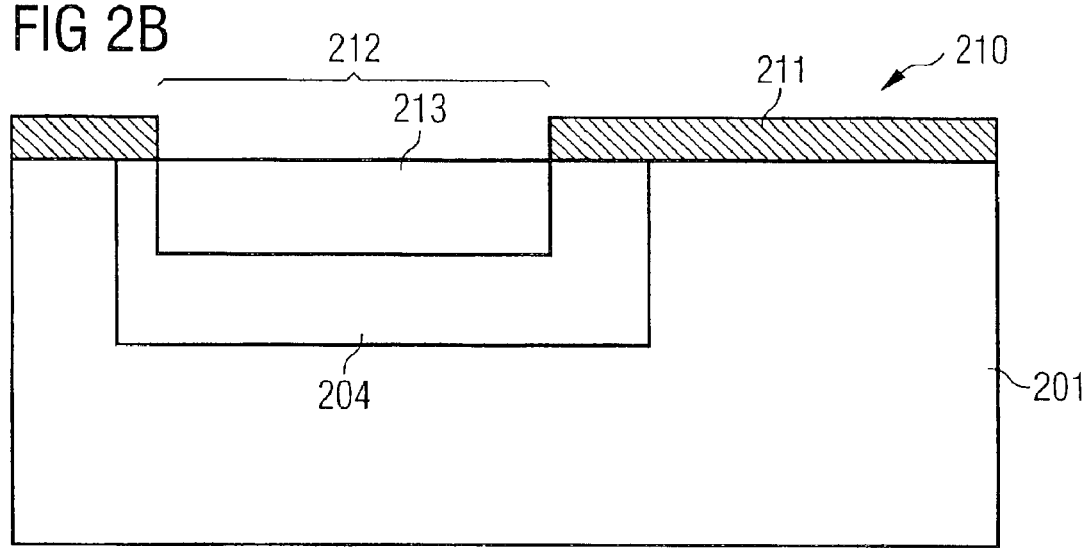

In order to obtain the layer sequence 210 shown in FIG. 2B, a second silicon dioxide layer 211 is deposited on the surface of the layer sequence 210 and is patterned using a lithography and an etching method in such a way that a second silicon dioxide window 212 is formed as a result. The lateral boundary of the second silicon dioxide window 212 defines the lateral extent of a first p⁺-doped region 213, which is subsequently formed by indiffusion of doping atoms of the p conduction type (for example boron atoms).

Figure 2C:
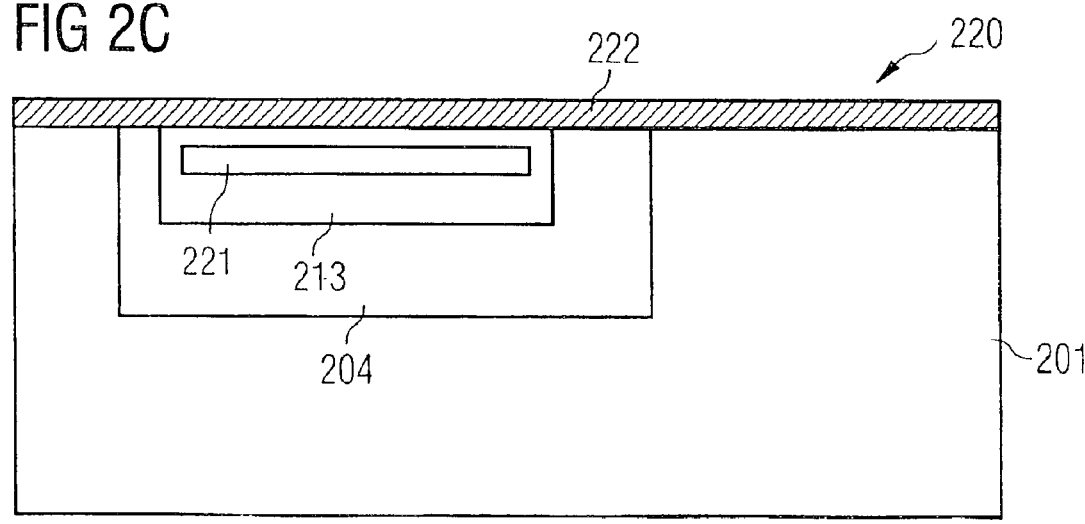

In order to obtain the layer sequence 220 shown in FIG. 2C, a metallically conductive structure 221 made of cobalt silicide is formed in the p⁺-doped region 213. This is done using the ion implantation method. Furthermore, the patterned, second silicon dioxide layer 211 is removed from the surface of the layer sequence, and a contiguous, third silicon dioxide layer 222 is formed on the surface of the layer sequence, thereby obtaining the layer sequence 220.

Figure 2D:
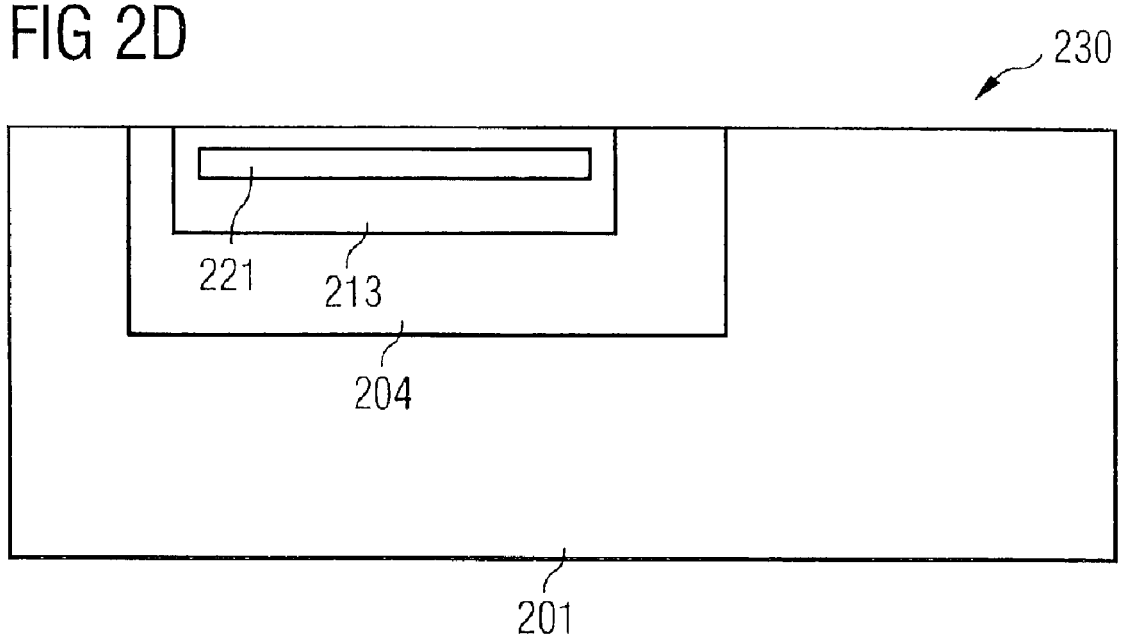

In order to obtain the layer sequence 230 shown in FIG. 2D, possible damage in the layer sequence 220 on account of the implantations carried out previously is thermally annealed in a further method step by an RTA method ("rapid thermal annealing") being carried out. In this case, the second silicon dioxide layer 222 serves as a protective layer. The second silicon dioxide layer 222 is removed after the RTA method has been carried out.

Figure 2E:
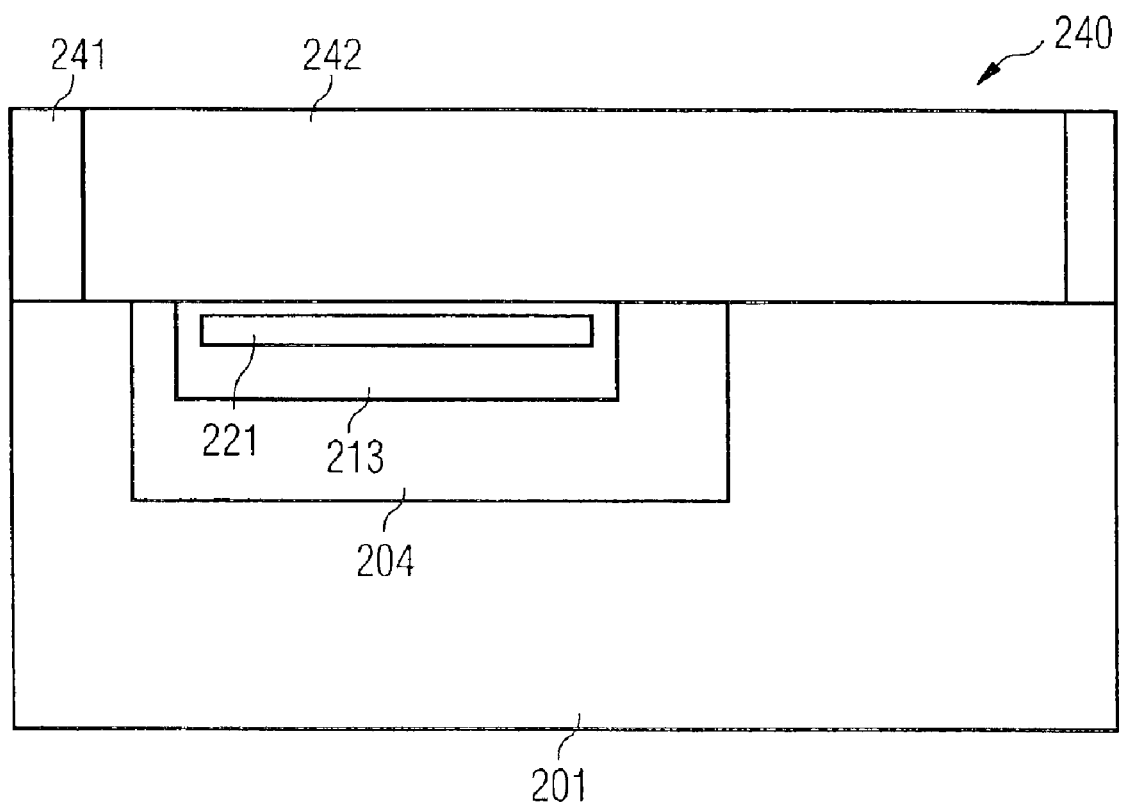

The layer sequence 240 shown in FIG. 2E is obtained by firstly a covering layer 241 made of silicon of the p conduction type being grown epitaxially on the layer sequence 230, so that the covering layer 241 is a monocrystalline silicon layer. Furthermore, a second n-doped well region 242 is formed using a further mask (not shown in the figures) in a laterally bounded surface region. This is done, in accordance with the exemplary embodiment described, by implantation of phosphorus atoms into the covering layer 241.

In order to obtain the layer arrangement 250—shown in FIG. 2F—in accordance with a second exemplary embodiment of the invention, produced in accordance with the second exemplary embodiment of the invention's method for producing a layer arrangement, a p-MOS vertical transistor 251 and a p-MOS peripheral transistor, the latter formed as a planar transistor, are formed on and in a respective surface region of the layer arrangement 250.

Both the components and the production method of the p-MOS vertical transistor 251 and of the p-MOS peripheral transistor 252 essentially correspond to what was described above with reference to FIG. 1E. Insofar as the transistors 251, 252 have identical components to the transistors 141, 142, these components are provided with identical reference numerals. Differences in the production method and in the individual components are described in detail.

The p-MOS vertical transistor 251 has a second p⁺-doped region 253, which is formed in a surface region of the layer arrangement 250 between the third and fourth insulation structures 148, 149 by means of a diffusion method, and which serves as second source/drain region of the p-MOS vertical transistor 251. Furthermore, a stacked capacitor 254 is formed on the second p-doped region 253, so that the p-MOS vertical transistor 251 forms the selection transistor and the stacked capacitor 254 forms the storage capacitor of a DRAM memory cell ("dynamic random access memory"). The stacked capacitor 254 is formed by a first and a second electrically conductive capacitor element 254a, 254c, between which a capacitor dielectric 254b is formed. In particular, the stacked capacitor 254 may have a dielectric having a high relative permittivity ("high-k material"). If the stacked capacitor has a ferroelectric dielectric, then the stacked capacitor and the p-MOS vertical transistor can be used as an FRAM memory cell ("ferroelectric random access memory"). It should be noted that, instead of the p-MOS vertical transistor 251, an n-MOS vertical transistor can also be provided and can realize the functionality of a switching transistor in a DRAM memory cell. The memory cell constituted of the p-MOS vertical transistor 251 and the stacked capacitor 254 can be addressed by means of the metallically conductive structure 251, which can fulfill the functionality of a bit line. The first p-doped region 213 has the functionality of the first source/drain region of the p-MOS vertical transistor 251, and that partial region of the second n-doped well region 242 which is bounded by the first p⁺-doped region 213, the second p⁺-doped region 253 and by the third and fourth insulation structures 148, 149 realizes the functionality of the channel region of the p-MOS vertical transistor 251. The third and fourth insulation structures 148, 149 serve as gate oxide layer. The first and second polysilicon structures 145, 146 have the functionality of a gate electrode. The p-MOS vertical transistor 251 is electrically insulated from the surroundings by means of the first and second insulation structures 143, 144.

The p-MOS peripheral transistor 252 differs from the n-MOS peripheral transistor 142 shown in FIG. 1E in that the two source/drain regions are formed by a third and a fourth p$^+$-doped region 255, 256 which are formed in a similar manner to the third and fourth n$^+$-doped regions 153, 154 shown in FIG. 1E.

The layer structure 250 can be used as a dynamic RAM memory cell (DRAM memory cell), the information to be stored being programmed into the stacked capacitor 254, and a DRAM memory cell of an arrangement of DRAM memory cells being selectable by the p-MOS vertical transistor 251, which serves as selection transistor, being brought to the conducting state by the application of a corresponding electrical potential to its gate terminal 145, 146.

The following publications are cited in this document:
[1] DE 295,19,160 C1
[2] Schüppen, A, Vescan, L, Jebasinski, R, v. d. Hart, A, Lüth, H (1992) "Effect of doping profiles on Si/CoSi$_2$ permeable base transistors" Microelectronic Engineering 18:259–266
[3] Risch, L, Rösner, W, Schulz, T (1999) "Transistor verkehrt" ["Topsy-turvy transistor"], Spektrum der Wissenschaft, June issue 1999, page 94 et seq.
[4] U.S. Pat. No. 4,877,755
[5] U.S. Pat. No. 5,747,371

What is claimed is:

1. A layer arrangement
having a monocrystalline substrate;
having a highly doped region in the substrate;
having a metallically conductive structure as buried interconnect in the highly doped region;
a partial region of the highly doped region that is arranged in a surface region of the substrate being monocrystalline.

2. The layer arrangement as claimed in claim 1, which has a covering layer on the surface region of the substrate.

3. The layer arrangement as claimed in claim 1 or 2, in which the highly doped region and the metallically conductive structure contained therein are arranged in a doped well region arranged in the substrate.

4. The layer arrangement as claimed in one of claims 1 to 3
in which the substrate is a silicon substrate., 5. The layer arrangement as claimed in one of claims 1 to 4,
in which the metallically conductive structure comprises a metallic material.

6. The layer arrangement as claimed in one of claims 1 to 5,
in which the metallically conductive structure comprises silicide material.

7. The layer arrangement as claimed in claim 6,
in which the metallically conductive structure comprises cobalt silicide and/or
tungsten silicide.

8. The layer arrangement as claimed in one of claims 2 to 7,
in which the covering layer is formed from monocrystalline material.

9. The layer arrangement as claimed in one of claims 2 to 8,
in which the covering layer is produced from silicon material.

10. The layer arrangement as claimed in one of claims 1 to 9,
having a transistor formed therein and/or thereon with a first and a second source/drain region, the first source/drain region being coupled to the metallically conductive structure.

11. The layer arrangement as claimed in claim 10,
in which the transistor is a vertical transistor.

12. The layer arrangement as claimed in claim 10 or 11,
having a capacitor formed therein and/or thereon, the capacitor being coupled to the second source/drain region of the transistor.

13. The layer arrangement as claimed in one of claims 1 to 12,
in which the highly doped region is laterally bounded in the substrate.

14. A memory cell
having a layer arrangement as claimed in one of claims 1 to 13.

15. A memory cell arrangement having a plurality of memory cells as claimed in claim 14.

16. The memory cell arrangement as claimed in claim 15, which is formed as a dynamic RAM memory.

* * * * *

UNITED STATES PATENT AND TRADEMARK OFFICE
CERTIFICATE OF CORRECTION

| | |
|---|---|
| PATENT NO. | : 6,900,495 B2 |
| APPLICATION NO. | : 10/314049 |
| DATED | : May 31, 2005 |
| INVENTOR(S) | : Hofmann et al. |

It is certified that error appears in the above-identified patent and that said Letters Patent is hereby corrected as shown below:

On the Title page, Item (30) after 101 62 578, please add --.2--.

On the Title page, Item (56), Other Publications, in the last publication under "Risch, L. Rosner" please delete "941" and add --94f--.

Column 11, line 33, after arrangement, please add --the arrangement comprising--.

Column 11, line 34, please delete "having".

Column 11, line 35, please delete "having".

Column 11, line 36, please delete "having".

Column 11, line 37, after region;, please add --and--.

Column 11, line 41, after claim 1, please add --further comprising--.

Column 11, line 42, please delete "which has".

Column 11, line 48, please delete "one of".

Column 11, line 48, please delete the letter "s" of the word claims.

Column 11, line 48, please delete "to".

Column 11, line 49, please delete "3".

Column 12, line 1, please delete "one of".

Column 12, line 1, please delete the letter "s" of the word claims.

Column 12, line 1, please delete "to".

Column 12, line 2, please delete "4".

Column 12, line 5, please delete "one of".

Column 12, line 5, please delete the letter "s" of the word claims.

Column 12, line 5, please delete "to".

UNITED STATES PATENT AND TRADEMARK OFFICE
CERTIFICATE OF CORRECTION

| | |
|---|---|
| PATENT NO. | : 6,900,495 B2 |
| APPLICATION NO. | : 10/314049 |
| DATED | : May 31, 2005 |
| INVENTOR(S) | : Hofmann et al. |

It is certified that error appears in the above-identified patent and that said Letters Patent is hereby corrected as shown below:

Column 12, line 6, please delete "5".

Column 12, line 10, please delete "comprises" and add --is selected from the group consisting of--.

Column 12, line 11, please delete "/or".

Column 12, line 13, please delete "one of".

Column 12, line 13, please delete the letter "s" of the word claims.

Column 12, line 13, please delete "to".

Column 12, line 14, please delete "7".

Column 12, line 17, please delete "one of".

Column 12, line 17, please delete the letter "s" of the word claims.

Column 12, line 17, please delete "to".

Column 12, line 18, please delete "8".

Column 12, line 21, please delete "one of".

Column 12, line 21, please delete the letter "s" of the word claims.

Column 12, line 22, please delete "to 9".

Column 12, line 22, please delete the letter "s" of the word claims.

Column 12, line 23, please delete "/or".

Column 12, line 30, please delete "/or".

Column 12, line 33, please delete "one of".

Column 12, line 34, please delete "to 12".

Column 12, line 38, please delete "one of".

UNITED STATES PATENT AND TRADEMARK OFFICE
CERTIFICATE OF CORRECTION

PATENT NO. : 6,900,495 B2
APPLICATION NO. : 10/314049
DATED : May 31, 2005
INVENTOR(S) : Hofmann et al.

It is certified that error appears in the above-identified patent and that said Letters Patent is hereby corrected as shown below:

Column 12, line 38, please delete the letter "s" of the word claims.

Column 12, line 39, please delete "to 13."

Signed and Sealed this

Seventh Day of November, 2006

JON W. DUDAS
*Director of the United States Patent and Trademark Office*